United States Patent
Gomi

(10) Patent No.: US 8,610,802 B2
(45) Date of Patent: Dec. 17, 2013

(54) SOLID-STATE IMAGING DEVICE WITH NOISE EXTRACING PIXELS IN THE EFFECTIVE PIXEL REGION AND SOLID-STATE IMAGING SYSTEM USING THE SAME

(75) Inventor: Yuichi Gomi, Hachioji (JP)

(73) Assignee: Olympus Corporation, Tokyo (JP)

( * ) Notice: Subject to any disclaimer, the term of this patent is extended or adjusted under 35 U.S.C. 154(b) by 491 days.

(21) Appl. No.: 12/243,048

(22) Filed: Oct. 1, 2008

(65) Prior Publication Data
US 2009/0086069 A1    Apr. 2, 2009

(30) Foreign Application Priority Data
Oct. 2, 2007  (JP) ................. 2007-258453

(51) Int. Cl.
*H04N 9/64* (2006.01)
(52) U.S. Cl.
USPC .......... 348/245; 348/241; 348/243; 348/294; 348/302; 348/308; 257/291; 257/292
(58) Field of Classification Search
USPC .......... 348/294, 243, 345, 302, 308; 257/291, 257/292
See application file for complete search history.

(56) References Cited

U.S. PATENT DOCUMENTS

| 3,969,764 | A * | 7/1976 | Tanaka | 348/291 |
|---|---|---|---|---|
| 2001/0028392 | A1* | 10/2001 | Yamamoto et al. | 348/207 |
| 2002/0085105 | A1* | 7/2002 | Sohn | 348/294 |
| 2004/0051802 | A1* | 3/2004 | Krymski | 348/308 |
| 2006/0268358 | A1* | 11/2006 | Okada | 358/448 |
| 2007/0201738 | A1* | 8/2007 | Toda et al. | 382/144 |
| 2008/0225140 | A1* | 9/2008 | Raynor et al. | 348/243 |
| 2009/0251580 | A1* | 10/2009 | Schemmann et al. | 348/308 |

FOREIGN PATENT DOCUMENTS

| JP | 05-122615 A | 5/1993 |
|---|---|---|
| JP | 07-087284 A | 3/1995 |
| JP | 09-238286 A | 9/1997 |
| JP | 2002-125155 A | 4/2002 |
| JP | 2006-121358 A | 5/2006 |
| JP | 2006-148525 A | 6/2006 |
| JP | 2007-19820 A | 1/2007 |
| JP | 2007-123414 A | 5/2007 |

OTHER PUBLICATIONS

Notice of Reasons for Rejection mailed Jan. 17, 2012, issued in corresponding Japanese Patent Application No. .2007-258453, with English translation (4 pages).
Notice of Reasons for Rejection mailed Jul. 25, 2012, issued in corresponding Japanese Patent Application No. A 2007-258453, with English translation (6 pages).

* cited by examiner

*Primary Examiner* — Sinh Tran
*Assistant Examiner* — Paul Berardesca
(74) *Attorney, Agent, or Firm* — Westerman, Hattori, Daniels & Adrian, LLP

(57) ABSTRACT

A solid-state imaging device having within a pixel region where pixels containing photoelectric conversion device are two-dimensionally arranged, a plurality of noise extracting pixels for outputting a noise signal not depending on incident light amount provided in an effective pixel region from which image signal associated with object image is outputted, disposed in a manner scattered into two dimensions so that, taking N×N (N being an integer of 2 or more) pixels within the effective pixel region as unit block, at least one is provided in each row and in each column within that unit block.

5 Claims, 11 Drawing Sheets a: HIGHLIGHT PATTERN b: BAND-LIKE PATTERN NOISE

CORRECTED IMAGE S3
(IMAGE AFTER CORRECTION OF HORIZONTAL BAND-LIKE NOISE)

(CORRECTION) SUBTRACTION

PHOTOGRAPH IMAGE S1

CORRECTING IMAGE S2
(HORIZONTAL BAND-LIKE NOISE)

PHOTOGRAPH IMAGE S1

CORRECTING IMAGE S2
(DARK CURRENT UNEVENNESS NOISE)

(CORRECTION) SUBTRACTION

CORRECTED IMAGE S3
(IMAGE AFTER CORRECTION OF DARK CURRENT UNEVENNESS NOISE)

SOLID-STATE IMAGING DEVICE WITH NOISE EXTRACING PIXELS IN THE EFFECTIVE PIXEL REGION AND SOLID-STATE IMAGING SYSTEM USING THE SAME

This application claims benefit of Japanese Patent Application No. 2007-258453 filed in Japan on Oct. 2, 2007, the contents of which are incorporated by this reference.

BACKGROUND OF THE INVENTION

The present invention relates to solid-state imaging device and to a solid-state imaging system using the solid-state imaging device, and more particularly relates to a noise correction of an output of solid-state imaging device.

It is known in those solid-state imaging devices used for example in video camera that pattern noises occur due to its various factors. One of the pattern noises is a stripe-like pattern noise in a vertical or horizontal direction which occurs due to variance among circuits disposed in row or column direction, and another is an unevenness pattern noise due to variance in pixel characteristics such as the variance in dark current that occurs in each pixel. These are referred to as a fixed pattern noise, since the location where these noises occur is fixed.

Further, a pattern noise depending on the luminance and/or shape of object is also known as pattern noise. For example, when image is taken of an object having a highlight pattern as shown in FIG. 1A, a band-like pattern noise "b" on the left and right sides of the highlight pattern "a" as shown in FIG. 1B may occur in the image signals obtained from solid-state imaging device. This band-like pattern noise "b" occurs for example such that a circuit section provided within the solid-state imaging device for reading pixel signals and/or bias inputted from the outside for example are affected by fluctuation of signal level in the highlight pattern "a". The band-like pattern noise "b" appears on an image signal as if an offset is superimposed on the image signal. Further, the image may appear in an outwardly extended manner about the highlight pattern "a" due to diffusion of electric charge within the semiconductor substrate which forms the solid-state imaging device.

As a method for correcting these noises, it has been known to use a circuit as shown in FIG. 2 as disclosed for example in Japanese Patent Application Laid-Open 2002-125155. This method is performed as in the following. In particular in FIG. 2, when a shutter button (not shown) is turned ON, a light-shielding plate 31 is opened through a driver 40 by control signal from a system controller 42. An object image is thereby formed on an imaging plane of a CCD 32 by an optical system (not shown) provided at a front stage of the light-shielding plate 31, and such object image is photoelectrically converted by the CCD 32 which is driven by a driver 41. Thus obtained imaging signals are A/D-converted at an A/D converter 33 and then accumulated at a frame memory 34 as image signals.

Next, a photoelectric conversion is effected by the CCD 32 in a dark condition where the light-shielding plate 31 is closed. Since thus obtained imaging signals are obtained by photoelectric conversion effected in a condition where light from the outside onto the CCD 32 is completely cut off, these are used as noise component data $S_N$ of a fixed pattern noise of the CCD 32.

Thus obtained noise component data $S_N$ are directly inputted to one end of a subtractor 36 without being subjected to such processing as A/D conversion by the A/D converter 33. In synchronization with the inputting of the noise component data $S_N$ into the subtractor 36, then, the image signals of object accumulated at the frame memory 34 are D/A-converted at a D/A converter 35 and are inputted to the other end of the subtractor 36 as analog image signals $S_D$. A subtraction processing, i.e. $S_D$-$S_N$ is then conducted at the subtractor 36 so that a correction signal S from which noise components of CCD 32 are removed is obtained. The correction signal S is subjected to a predetermined processing at a process circuit 38 and then given to a recording apparatus 39 so as to be recorded. In other words, the method using the circuit of FIG. 2 is to generate a light-shielded image signal at each image taking by providing a means for cutting off the light from the object to the imaging device, and to provide an output by subtracting the image signal at the time of cutting off the light from the image signal of the main photographing where the light is allowed to be incident. It should be noted that what is denoted by numeral 37 in FIG. 2 is a switch for outputting the correction signal S or uncorrected signal in a switching manner.

Further, there is a known solid-state imaging device as shown in FIG. 3 which is disclosed in Japanese Patent Application Laid-Open 2007-19820. FIG. 3 shows the construction of a pixel section of the solid-state imaging device disclosed in the publication, where 501 and 502 denote an effective pixel region and a light-shielded region (OB region), respectively. The light-shielded pixels denoted by 503 are then scattered within the effective region 501. By disposing the light-shielded pixels 503 within the effective pixel region 501 in this manner, a black level of the effective pixel region 501 as a whole can be grasped. An unevenness pattern noise due to variance in dark current can thus be corrected with using the light-shielded pixels 503 provided within the effective pixel region 501.

SUMMARY OF THE INVENTION

In a first aspect of the invention, there is provided a solid-state imaging device having within a pixel region where pixels containing photoelectric conversion device are two-dimensionally arranged, a plurality of noise extracting pixels for outputting a noise signal not depending on incident light amount provided in an effective pixel region from which image signal associated with object image is outputted, disposed in a manner scattered into two dimensions so that, taking N×N (N being an integer of 2 or more) pixels within the effective pixel region as unit block, at least one is provided in each row and in each column within that unit block.

In a second aspect of the invention, pixels in the effective pixel region in the solid-state imaging device according to the first aspect contain colors pixels of a plurality of colors, the noise extracting pixels being provided correspondingly to each color pixel.

In a third aspect of the invention, pixels in the effective pixel region in the solid-state imaging device according to the first aspect contain colors pixels of a plurality of colors, the noise extracting pixels being provided correspondingly to only certain color pixels.

In a fourth aspect of the invention, the noise extracting pixels in the solid-state imaging device according to any one of the first to third aspects are shielded from light.

In a fifth aspect of the invention, the solid-state imaging device according to any one of the first to third aspects further includes a control section for controlling an operation of the pixels, the noise extracting pixels outputting the image signal or the noise signal based on control of the control section.

In a sixth aspect of the invention, there is provided a solid-state imaging system including: the solid-state imaging device according to any one of the first to fifth aspects; a correcting image generation section for a generating a correcting image signal from the noise signal; and a correction section for correcting the image signal with the correcting image signal.

BRIEF DESCRIPTION OF THE DRAWINGS

FIGS. 15A to 15D show the manner of disposition of the noise extracting pixels in the pixel section of a solid-state imaging device for generating color image.

FIG. 16 shows the manner where the noise extracting pixels are disposed by unit of a plurality of pixels.

DESCRIPTION OF THE PREFERRED EMBODIMENTS

Some embodiments of the solid-state imaging device according to the invention and the solid-state imaging system using the same will be described below with reference to the drawings.

Embodiment 1

Figure 5:
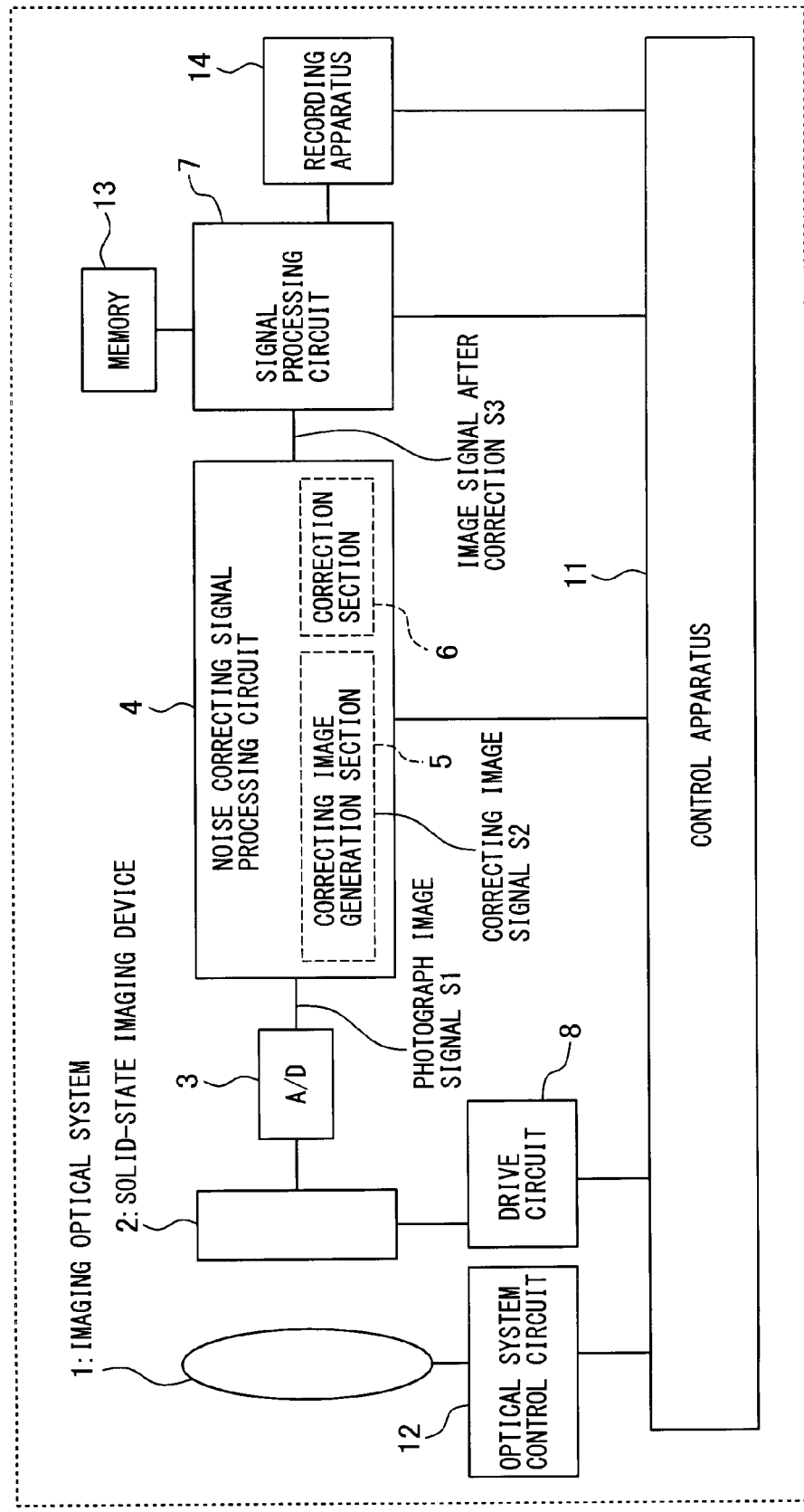
FIG. 5 is a block diagram showing construction of a first embodiment of the solid-state imaging system according to the invention.

A first embodiment will now be described. FIG. 5 is a block diagram showing construction of the first embodiment of the solid-state imaging system according to the invention. Referring to FIG. 5, what is denoted by 1 is a taking optical system for photographing of which focal distance and aperture stop are controlled by an optical system control circuit 12. 2 is a solid-state imaging device of which drive is controlled by a driver circuit 8. The solid-state imaging device 2 outputs an object image formed by the taking optical system 1 as image signals. Further, a plurality of noise extracting pixels for outputting noise signal are provided as will be described in detail in an effective pixel region of the solid-state imaging device 2.

Figure 6:
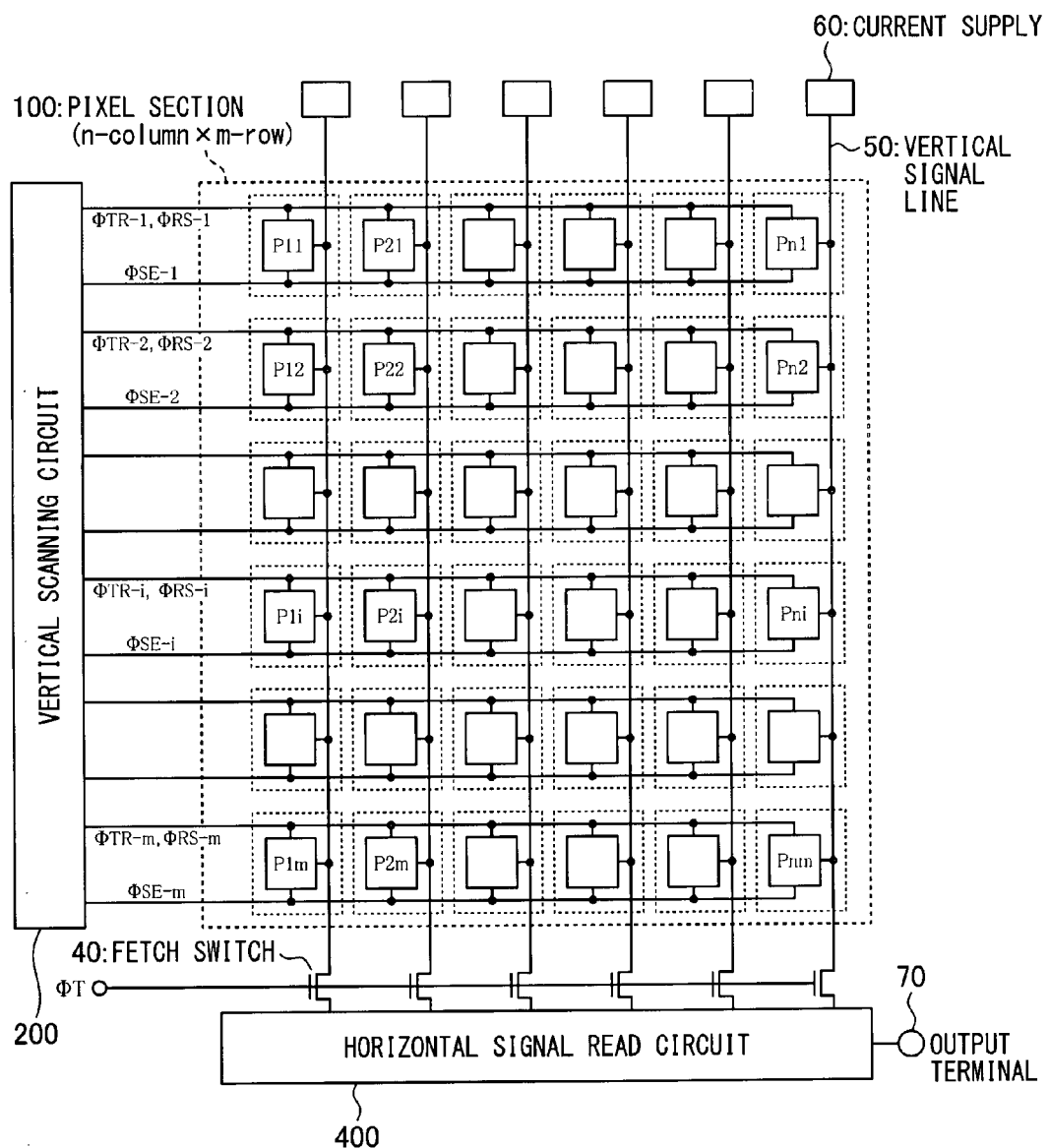
FIG. 6 is a circuit diagram showing construction of the solid-state imaging device in FIG. 5.

The construction of the solid-state imaging device 2 is shown in FIG. 6. Referring to FIG. 6, what is denoted 100 is a pixel region, shown in this case as arrangement of n-column×m-row pixels as indicated by P11 to Pnm. 200 is a vertical scanning circuit for controlling an operation of the pixels, which selects pixels by unit of row and causes pixel signals of the selected row to be outputted onto a vertical signal line 50 which is provided for each column. 400 is a horizontal read circuit where pixel signals corresponding to one row selected by the vertical scanning circuit 200 and outputted onto the vertical signal line 50 are fetched through a fetch switch 40 which is controlled by a fetch pulse ΦT. It then outputs signals of the pixels of that row from an output terminal 70 in time series in order of their horizontal arrangement. 60 is a current supply connected to the vertical signal line 50.

Figure 7:
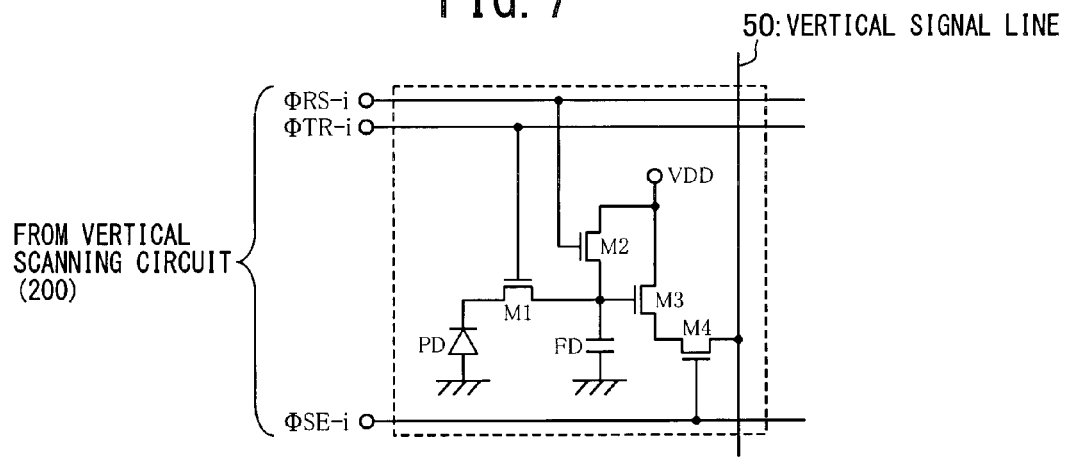
FIG. 7 is a circuit diagram showing pixel construction in the solid-state imaging device shown in FIG. 6.

The construction of a pixel used in the solid-state imaging device 2 is shown in FIG. 7. Referring to FIG. 7, what is denoted by PD is a photodiode (photoelectric conversion device), and FD is an electric charge detecting section composed of a capacitor device for detecting signal electric charges generated and accumulated at the photodiode PD. Here, the electric charge detecting section FD is shielded from light. M1 is a transistor for transferring the signal of the photodiode PD to the electric charge detecting section FD, which is controlled by a transfer pulse ΦTR-i (i=1, 2, ... m). M3 is an amplification transistor which forms a source follower amplifier together with a current supply 60 provided on the vertical signal line 50. The signal of the electric charge detecting section FD is amplified by the amplification transistor M3 and then outputted onto the vertical signal line 50 through a select transistor M4. The select transistor M4 is controlled by a select pulse ΦSE-i. M2 is a reset transistor controlled by a reset pulse ΦRS-I, for controlling connection from the electric charge detecting section FD as well as an input section of the amplification transistor M3 to a pixel power supply VDD. Here, the select pulse ΦSE-i, transfer pulse ΦTR-i, and reset pulse ΦRS-i are outputted by the vertical scanning circuit 200 shown in FIG. 6, and are indicted in FIG. 6 by ΦSE-1 to ΦSE-m, ΦTR-1 to ΦTR-m, and ΦRS-1 to ΦRS-m.

Figure 8:
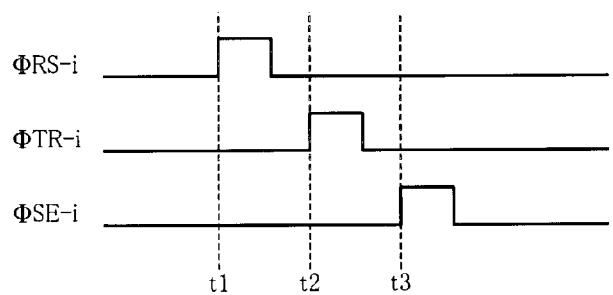
FIG. 8 is a timing chart for explaining operation of the pixels shown in FIG. 7.

FIG. 8 is a timing chart for explaining operation of the pixel shown in FIG. 7. It is supposed that, at a point in time t1 of FIG. 8, signal electric charges generated by a light signal are accumulated at the photodiode PD of pixels on a selected one horizontal line. At time t1, when reset pulse ΦRS-i at H level for turning ON the reset transistor M2 is given, the electric charge detecting section FD is reset to the pixel power supply VDD. Next, the reset transistor M2 is turned OFF, and H-level transfer pulse ΦTR-i for turning ON the transfer transistor M1 of the pixels of the selected row is given at time t2 so as to transfer the signal electric charges accumulated at the photodiode PD to the electric charge detecting section FD. Even when the transfer pulse ΦTR-i is subsequently brought to L level to turn OFF the transfer transistor M1, the electric charge detecting section FD is kept at a value based on the above described signal electric charges. At the photodiode PD, on the other hand, all of the accumulated signal electric charges is transferred to the electric charge detecting section FD so that it attains an empty state of signal electric charge. In other words, the photodiode PD has been reset. The photodiode PD then starts accumulation of signal electric charge generated by light signal after that point. At time t3, then, the select pulse ΦSE-i is driven to H level so that the pixel signal obtained by amplifying the signal of the electric charge detecting section FD is outputted onto the vertical signal line 50. After that, pixel signals are outputted from the output terminal 70 through the fetch switch 40 and the horizontal read circuit 400.

Figure 9:
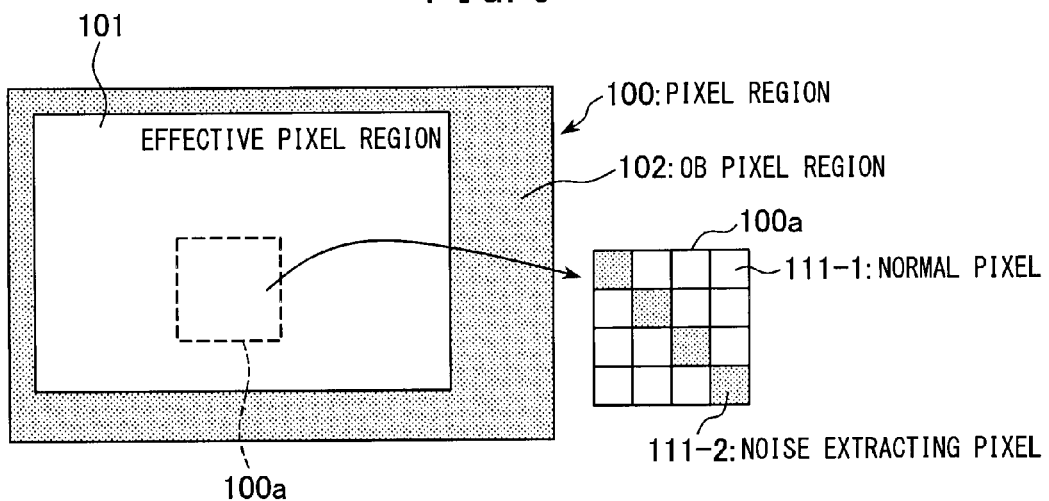
FIG. 9 shows construction of the pixel section of the solid-state imaging device shown in FIG. 6.

The construction of the pixel region 100 of the solid-state imaging device 2 is shown in FIG. 9. The pixel region 100 is composed of an OB region 102 for outputting black level signal and an effective pixel region 101 that actually contributes to the taking of an object image. Provided in the effective pixel region 101 are the pixels 111-1 as described in FIG. 7 (normal pixel), and pixels for extracting noise 111-2, where the noise extracting pixels 111-2 are shielded from light for example with using a wiring metal layer so as not to allow incidence of light on the photodiode PD. The noise extracting pixels 111-2 are provided so that, as shown in the figure, a total of 4 pixels or one pixel in each row and each column directions are within a 4×4-pixel block 100a.

Referring again to FIG. 5, what is denoted by 3 is an A/D conversion apparatus for converting an output signal of the solid-state imaging device 2 into a digital signal. 4 is a noise correction signal processing circuit for correcting a noise in the image signal S1 obtained from the solid-state imaging device 2, which includes: a correcting image generation section 5 for generating a correcting image signal S2 from the noise extracting pixels 111-2 provided within the effective pixel region 101 of the solid-state imaging device 2; and a correction section 6 for correcting the image signal S1 of the solid-state imaging device 2 by the correcting image signal S2. 7 is a signal processing circuit where an image signal S3 corrected of noise at the noise correction signal processing circuit 4 is processed. 13 is a memory apparatus for temporarily storing the signal processed at the signal processing circuit 7, and 14 is a recording apparatus for recording image at final stage. Further, 11 is a control apparatus for administering the control of the solid-state imaging system as a whole, which controls all of the drives of the taking optical system and the solid-state imaging device, the correction operation from generation of the correcting image signal to the correction, and the operation associated with image taking such as signal processing and recording.

Figure 1A:
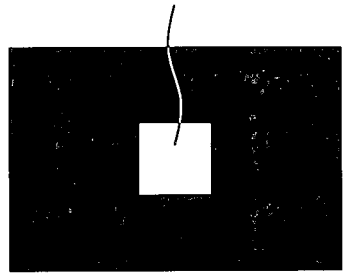
FIGS. 1A and 1B show the manner of occurrence of a band-like pattern noise when image of an object having highlight pattern is taken.
Figure 1B:
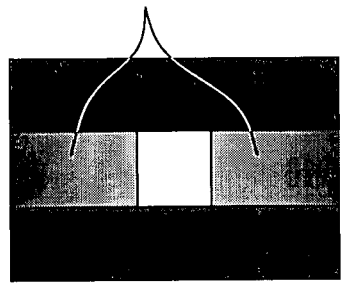
Figure 2:
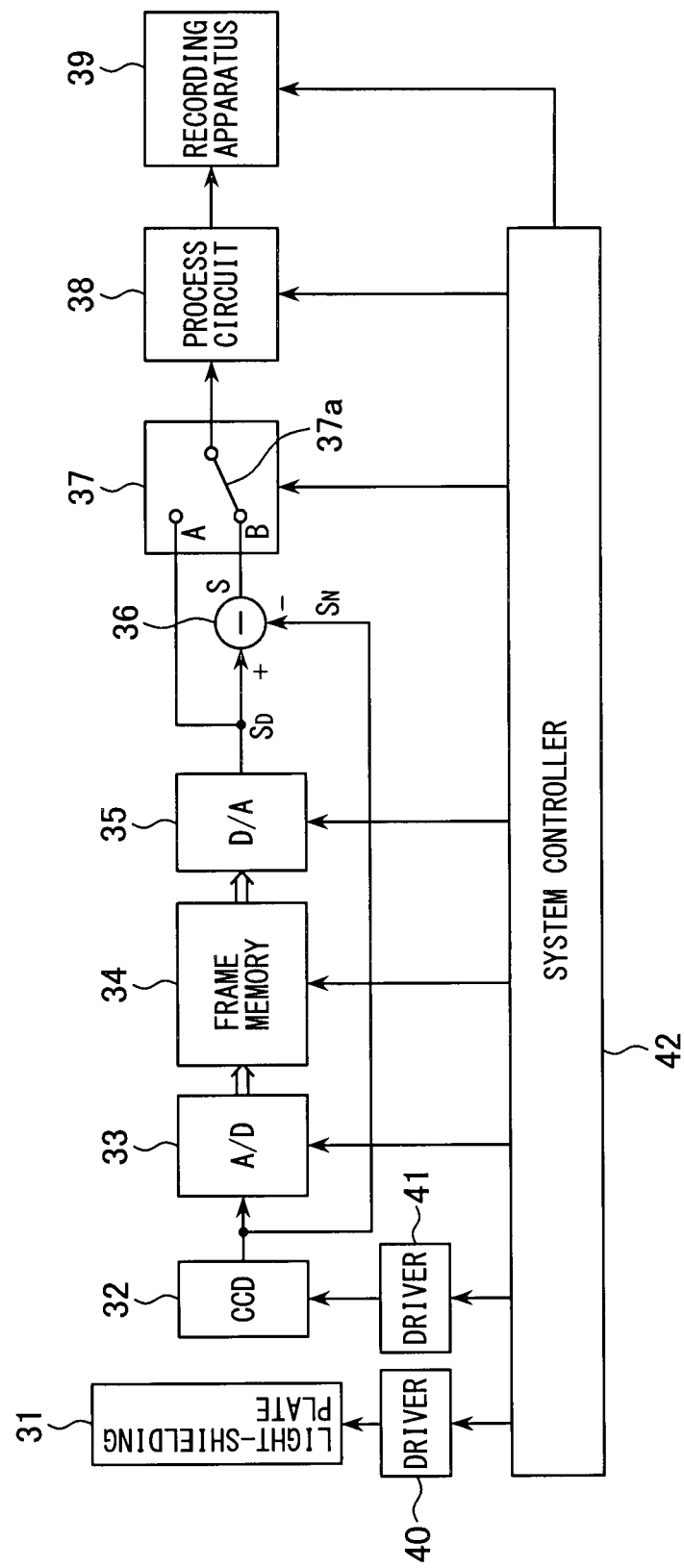
FIG. 2 is block diagram showing construction of a solid-state imaging apparatus having a prior-art noise correction means.
Figure 3:
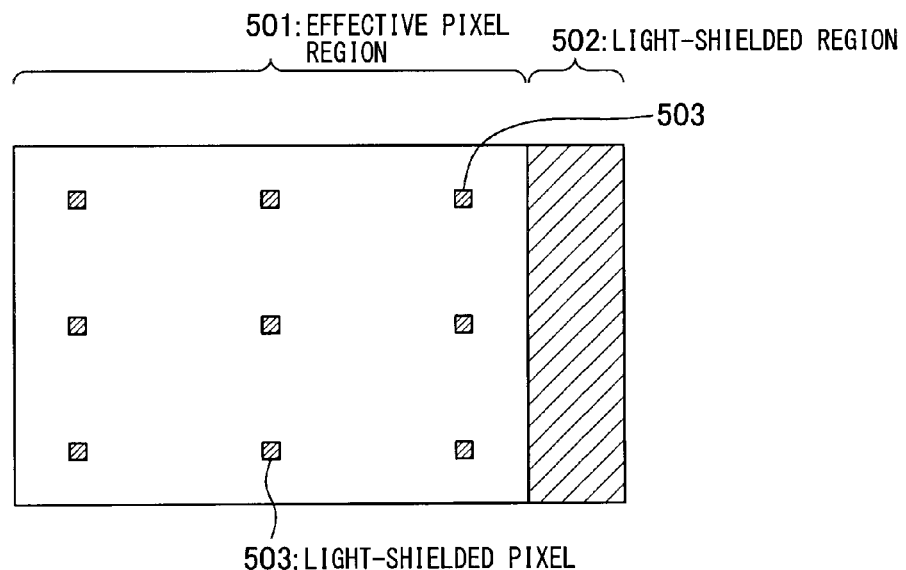
FIG. 3 shows construction of a pixel region of another solid-state imaging apparatus having a prior-art noise correction means.
Figure 4:
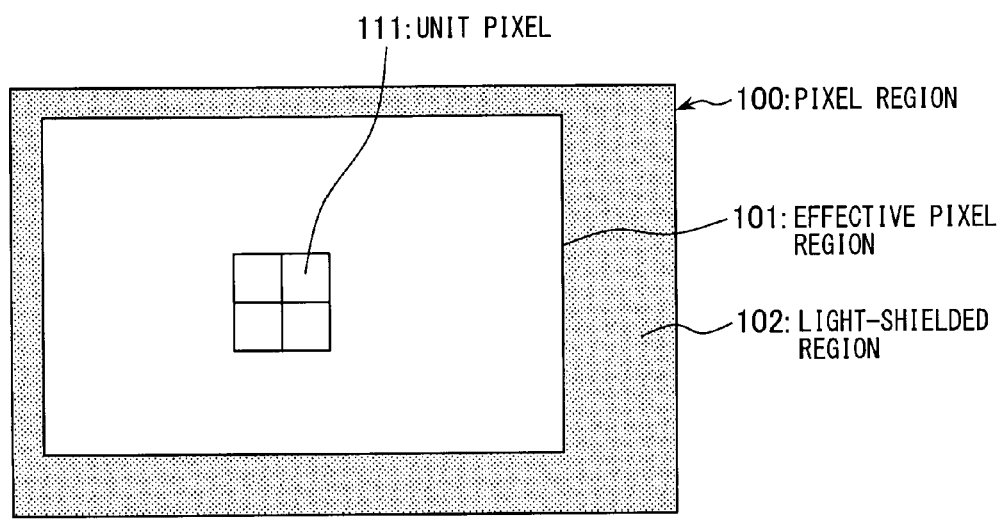
FIG. 4 shows construction of a pixel region in a general solid-state imaging device.
Figure 10C:
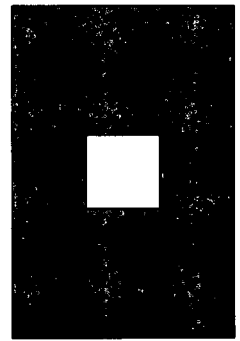
FIGS. 10A to 10C illustrates an overall operation of the solid-state imaging system shown in FIG. 5.
Figure 10A:
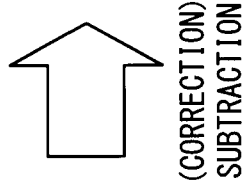
Figure 10A:
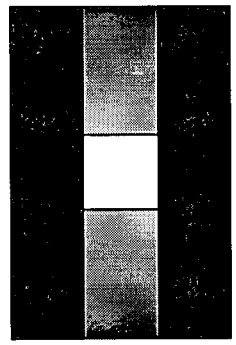

An overall operation of the solid-state imaging system shown in FIG. 5 will now be described. A description will be given below with respect to the case where an image of the object having the highlight pattern shown in FIG. 1A is to be taken. Of the solid-state imaging system shown in FIG. 5, the optical system control circuit 12 and the drive circuit 8 are controlled by instruction of the control apparatus 11 to effect image taking of the object by the solid-state imaging device 2. The image signal obtained by the solid-state imaging device 2 is converted into digital signals at the A/D conversion apparatus 3. It is supposed here that the band-like pattern noise such as one previously described (FIG. 1B) occurs in the taken photograph image signal S1, and an image as shown in FIG. 10A is attained. It should be noted that only the image obtained from the normal pixels 111-1 within the effective pixel region of the solid-state imaging device 2 is shown in the image of FIG. 10A. The digitized photograph image signals S1 are inputted to the noise correction signal processing circuit 4.

Figure 10B:
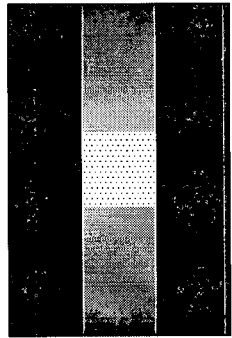

Here, at the correcting image signal generation section 5, only the signals by the noise extracting pixels 111-2 are extracted from the digitized photograph image signals S1 so as to generate the noise correcting image signal S2 from such signals. Since the noise extracting pixels 111-2 are the pixels shielded from light, the signals thereof do not depend on incident light and become signals corresponding to an offset change amount of the circuits provided within the solid-state imaging device 2. The correcting image signal S2 is shown in FIG. 10B. At the correction section 6, then, the correcting image signal S2 is used to correct the photo graph image signal S1. Here, since the band-like pattern noise to be corrected is the offset change amount, the correcting operation becomes a subtraction processing of the correcting image signal S2 from the photograph image signal S1. The image signal after correction S3 corrected by such subtraction processing are shown in FIG. 10C. The corrected image signal S3 are inputted to the signal processing circuit 7 to be subjected to color processing, interpolation, γ-processing, etc., and a final photograph data is saved in the recording apparatus 14.

As described above, the pixels for noise extraction shielded from light are provided within the effective pixel region of the solid-state imaging device in the solid-state imaging system of the present embodiment. It is thereby possible to extract pattern noise components due to circuit offset change which occurs at the solid-state imaging device 2. By subtracting the extracted pattern noise components from the photograph image to make correction, it is possible to obtain an excellent image without pattern noise. Further, the pattern noise can be extracted at the same time of performing the photographing operation. For this reason, it is unnecessary to perform an extra image taking operation for the extraction, and it is possible also to correct a pattern noise that occurs depending on the luminance of the object and/or its shape.

Figure 11:
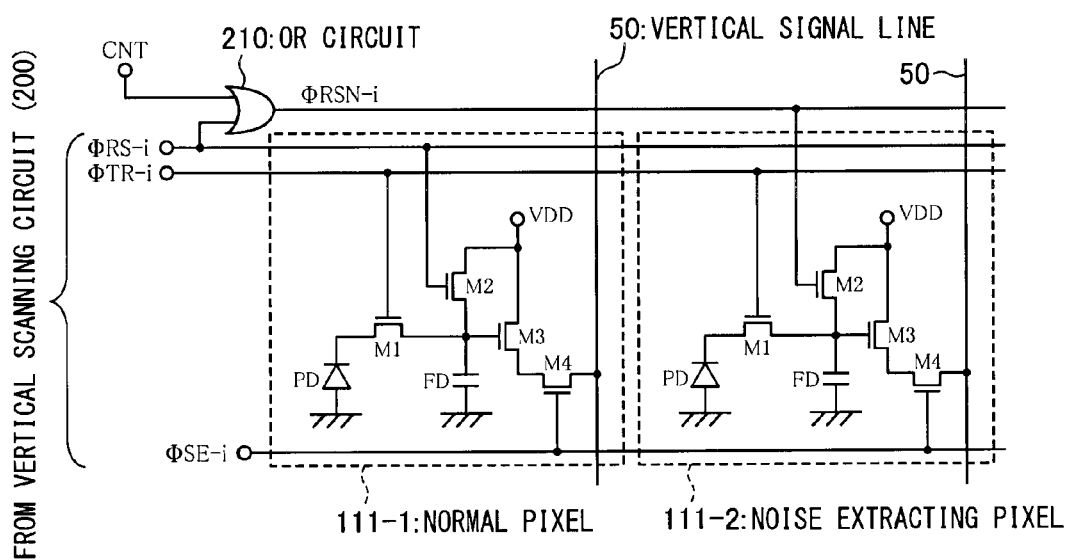
FIG. 11 is a circuit diagram showing a part of a modification of the solid-state imaging device in the first embodiment.

It should be noted that, while the case of using light-shielded pixels as the noise extracting pixels 111-2 in the effective pixel region has been shown in the above described embodiment, one as shown in FIG. 11 may also be used as the construction of the solid-state imaging device.

The solid-state imaging device shown in FIG. 11 is constructed such that an OR circuit 210 to which the reset pulse ΦRS-i and a control signal CNT are inputted to output a logical OR thereof is provided in each row of the solid-state imaging device shown in FIG. 6 so that operation of the pixels is controlled by the vertical scanning circuit 200 and the OR circuit 210. In this case, the noise extracting pixels 111-2 are not shielded from light. In the solid-state imaging device shown in FIG. 11, while the pixel construction itself is the same as the construction shown in FIG. 7, the control method of reset pulse for controlling the reset transistor M2 is different.

Figure 12A:
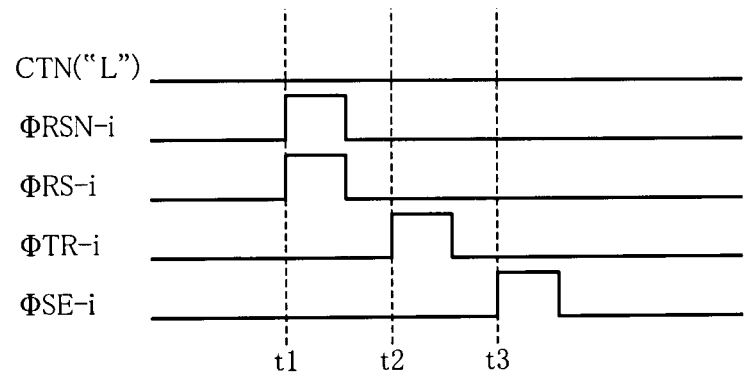
FIGS. 12A and 12B each are a timing chart for explaining operation of the modification shown in FIG. 11.
Figure 12B:
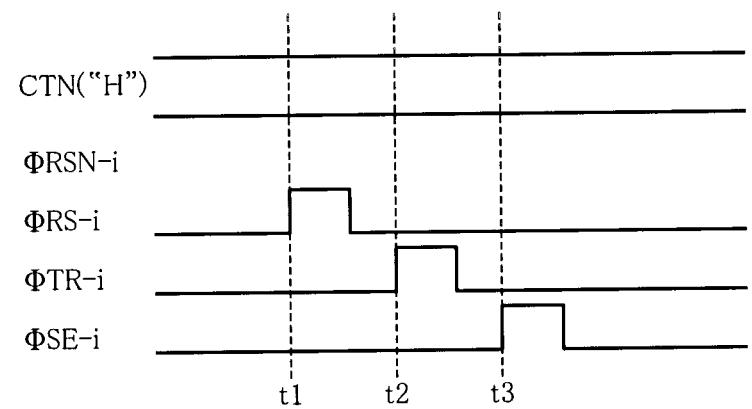

In the solid-state imaging device of the construction shown in FIG. 11, reset pulse ΦRSN-i for controlling the reset transistor M2 of the noise extracting pixel 111-2 is formed of a logical sum of the reset pulse ΦRS-i and the control signal CNT. When the control signal CNT is at L level, the reset pulse ΦRSN-i of the noise extracting pixel 111-2 becomes the same as the reset pulse ΦRS-i of the normal pixel 111-1 as shown in FIG. 12A. On the other hand, when the control signal CNT is at H level, the reset pulse ΦRSN-i of the noise extracting pixel 111-2 is continuously kept at H level as shown in FIG. 12B. Accordingly, by maintaining the control signal CNT at H level, the FD section of the noise extracting pixel is continuously kept in its reset condition, whereby it is possible to consider the noise extracting pixel 111-2 as substantially an equivalent to a light-shielded pixel in the case where accumulation time is short so that an influence of dark current is absent. It should be noted that, since the noise extracting pixel becomes the same as the normal pixel if the control signal CNT is brought to L level, it can be treated similarly as the normal pixel when correction of pattern noise is unnecessary.

Embodiment 2

Figure 13:
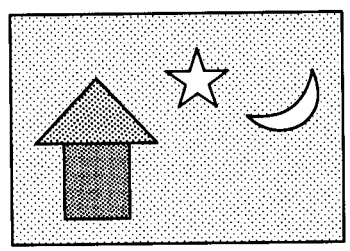
FIG. 13 shows the manner of an object to be taken as image in a second embodiment of the solid-state imaging system according to the invention.

A second embodiment of the solid-state imaging system according to the invention will now be described. The second embodiment concerns operation method when the manner of object is different from the first embodiment. The construction of the solid-state imaging system itself used in this case is identical to the first embodiment shown in FIG. 5 and will not be described. The second embodiment specifically concerns the operation method in the case of requiring the so-called "long-second exposure" where the object image as a whole is dark and thus exposure time is long. The manner of an object is shown in FIG. 13. Because the object shown in FIG. 13 is a night scene where the image as a whole is dark, it is necessary to make longer the exposure time when taking its image. For this reason, noise occurs of an unevenness pattern due to variance in dark currents occurring at the pixels of the solid-state imaging device 2.

Figure 14A:
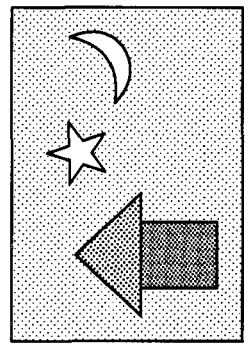
FIGS. 14A to 14C illustrates an overall operation of the second embodiment when image of the object shown in FIG. 13 is taken.

An operation in the second embodiment will now be described. Similarly to the first embodiment, the optical system control circuit 12 and the drive circuit 8 in the solid-state imaging system are controlled by instruction of the control apparatus 11 so as to take image of the object by the solid-state imaging device 2. The image signals obtained by the solid-state imaging device 2 are converted into digital signals at the A/D converter 3. Thus taken photograph image signal S1 results in the image as shown in FIG. 14A, since as described, the unevenness pattern noise due to dark current of the pixel occurs. A case is shown here of an occurrence of unevenness where the lower-right side of a frame is darker while the upper-left side is lighter.

Figure 14B:
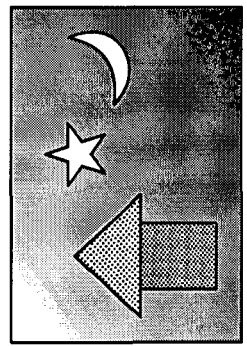
Figure 14C:
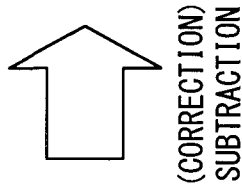
Figure 14C:
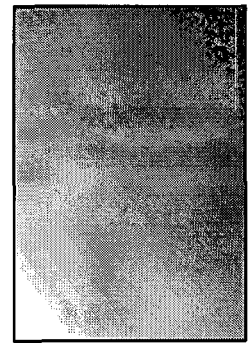

It should be noted that only an image obtained from the normal pixels 111-1 within the effective pixel region of the solid-state imaging device 2 is shown in the image of FIG. 14A. The digitized photograph image signal S1 is inputted to the noise correction signal processing circuit 4. Here, at the correcting image signal generation section 5, only the signals by the noise extracting pixels 111-2 are extracted from the digitized photograph image signal S1 so as to generate the noise correcting image signal S2 from such signal. Here, since the noise extracting pixels 111-2 are the pixels shielded from light, the noise correcting image signal S2 is the signal only formed of dark currents of the pixels that do not depend on the object image, i.e. the signal corresponding to the unevenness of the dark currents where the lower-right side of frame is darker while the upper-left side is lighter as shown in FIG. 14B. At the correction section 6, then, the noise correcting image signal S2 is used to correct the photograph image signal S1. Here, since the unevenness pattern noise to be corrected is the offset change due to dark current, the correcting operation becomes a subtraction processing of the noise correcting image signal S2 from the photograph image signal S1. The image signal S3 after correction corrected by such subtraction processing are shown in FIG. 14C. The corrected image signal S3 is inputted to the signal processing circuit 7 to be subjected to color processing, interpolation, γ-processing, etc., and a final photograph data is saved in the recording apparatus 14.

As described above, the pixels for noise extraction shielded from light are provided within the effective pixel region of the solid-state imaging device in the solid-state imaging system of the present embodiment. It is thereby possible to extract unevenness pattern noise components due to variance in dark currents occurring at the solid-state imaging device 2. By subtracting the extracted pattern noise components from the photograph image to make correction, it is possible to obtain an excellent image without pattern noise. Further, since the pattern noise can be extracted at the same time of performing the photographing operation, it is unnecessary to perform an extra image taking operation for the purpose of the extraction.

It should be noted that various modifications and alterations of each construction of the above described first and second embodiments are naturally possible without departing from its purpose, and the number of noise extracting pixels and their disposition pattern include but not limited to those shown in the first and second embodiments. In particular, it is naturally also possible to arrange the noise extracting pixels into a number or disposition pattern corresponding to the noise to be corrected or signal processing, and the disposition pattern may be repeated by the unit of block or be changed from one block to another. The block unit is also not limited to the 4×4-pixel block as shown in FIG. 9, and one may be formed of a pixel block generally represented by N×N (N being an integer of 2 or more).

Figures 15A, 15B, 15C, 15D, 16:
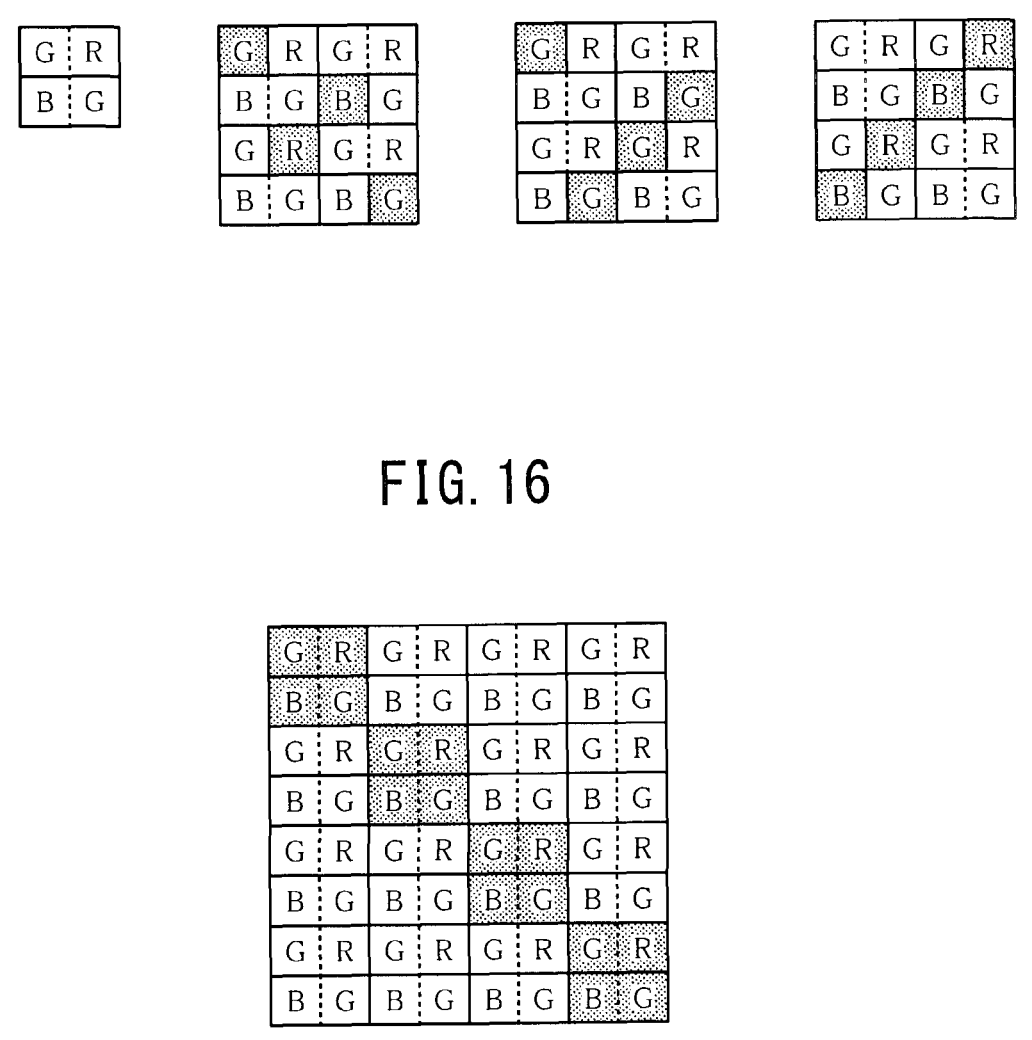

Further, for example, color pixels of a plurality of colors are arranged in the pixel region of the solid-state imaging device to generate color image. FIG. 15A shows a disposition pattern of color pixels referred to as Bayer method which is widely used in the solid-state imaging devices for digital still camera. Here, G, R, and B indicate a green pixel, a red pixel, and a blue pixel, respectively. It is thus possible to provide the noise extracting pixels at the locations where each color pixel is disposed so that noise signals can be uniformly extracted from the locations corresponding to each color pixel. An example of this case is shown in FIG. 15B. Further, it is also possible as shown in FIG. 15C to provide the noise extracting pixels at the locations where the most numerous color pixel (G pixel in the case of Bayer method) of the color pixels of the plurality of colors is disposed. Conversely, it is also possible to provide the noise extracting pixels at the locations where R and B pixels are disposed so that a priority is given to resolution. FIG. 15D shows the case where the noise extracting pixels are provided at the locations where R and B pixels are disposed. Further, a plurality of pixels may be used as one unit of the noise extracting pixels, FIG. 16 showing the case where 2×2-pixel blocks are disposed as the noise extracting unit pixels.

According to the invention as has been described by way of the above embodiments, simultaneously of the object information from the solid-state imaging device, signal having information of pattern noise can also be obtained from the noise extracting pixels provided within the effective pixel region. Accordingly, by generating correcting image signal to make correction with using this pattern noise information, the pattern noise occurring in a light incident condition can also be corrected and since a taking of image for the purpose of acquiring the correcting image signal is not necessary, an extra time is also unnecessary. Further, taking N×N (N being an integer of 2 or more) pixels as unit block, since at least one noise extracting pixel is provided in each row and in each column within the unit block, an excellent correction is possible even of the pattern noise having conspicuous edges.

What is claimed is:

1. A solid-state imaging device comprising within a pixel region where pixels each containing a photoelectric conversion device are two-dimensionally arranged, a plurality of noise extracting pixels for outputting a noise signal not depending on incident light amount provided in an effective pixel region from which an image signal associated with an object image is outputted, disposed in a manner scattered into two dimensions so that, taking N×N (N being an integer of 2 or more) pixels within said effective pixel region as a unit block, at least one is provided in each row and in each column within that unit block, wherein only said plurality of noise extracting pixels within the pixel region are shielded from the incident light amount by a metal layer so as not to allow the incident light amount on the photoelectric conversion device of said noise extracting pixels, and wherein at least one of said plurality of noise extracting pixels within said unit block is vertically or horizontally directly adjacent to two pixels not shielded from incident light from which an image signal associated with an object image is outputted.

2. The solid-state imaging device according to claim 1, wherein pixels in said effective pixel region contain color pixels of a plurality of colors, and said noise extracting pixels are provided correspondingly to each color pixel.

3. The solid-state imaging device according to claim 1, wherein pixels in said effective pixel region contain color pixels of a plurality of colors, and said noise extracting pixels are provided correspondingly to only certain color pixels.

4. The solid-state imaging device according to claim 1, further comprising a control section for controlling an operation of said pixels, wherein said noise extracting pixels output said noise signal based on control of said control section.

5. A solid-state imaging system comprising:

the solid-state imaging device according to any one of claims 1 to 3 and 4;

a correcting image generation section for generating a correcting image signal from said noise signal; and a correction section for correcting said image signal with said correcting image signal.

* * * * *